United States Patent
Girard et al.

(10) Patent No.: US 10,348,084 B2
(45) Date of Patent: Jul. 9, 2019

(54) SURGE PROTECTOR FOR A TRANSCEIVER

(71) Applicant: INTERDIGITAL CE PATENT HOLDINGS, Paris (FR)

(72) Inventors: Henri Girard, Carmel, IN (US); Paul Knutson, Westfield, IN (US)

(73) Assignee: INTERDIGITAL CE PATENT HOLDINGS, Paris (FR)

( * ) Notice: Subject to any disclaimer, the term of this patent is extended or adjusted under 35 U.S.C. 154(b) by 187 days.

(21) Appl. No.: 15/310,466

(22) PCT Filed: Mar. 31, 2015

(86) PCT No.: PCT/US2015/023487
§ 371 (c)(1),
(2) Date: Nov. 11, 2016

(87) PCT Pub. No.: WO2015/183399
PCT Pub. Date: Dec. 3, 2015

(65) Prior Publication Data
US 2017/0077697 A1 Mar. 16, 2017

Related U.S. Application Data

(60) Provisional application No. 62/004,483, filed on May 29, 2014.

(51) Int. Cl.
*H02H 9/00* (2006.01)
*H02H 9/04* (2006.01)
(Continued)

(52) U.S. Cl.
CPC .............. *H02H 9/04* (2013.01); *H02H 9/005* (2013.01); *H03H 1/0007* (2013.01); *H04B 3/00* (2013.01); *H04N 7/102* (2013.01)

(58) Field of Classification Search
CPC ........ H02H 9/005; H02H 9/04; H03H 1/0007; H04B 3/00; H04N 7/102
(Continued)

(56) References Cited

U.S. PATENT DOCUMENTS

| 5,390,337 A | 2/1995 | Jelinek et al. |
| 7,430,103 B2 * | 9/2008 | Kato ...................... H02H 9/046 361/212 |

(Continued)

FOREIGN PATENT DOCUMENTS

| JP | 04357184 | 11/2009 |
| JP | 2010136122 | 6/2010 |

OTHER PUBLICATIONS

International Search Report dated Jun. 10, 2015 in corresponding International Application No. PCT/US2015/023487.

*Primary Examiner* — Kevin J Comber
(74) *Attorney, Agent, or Firm* — Shabtay S Henig; Jerome G Schaefer

(57) ABSTRACT

An input N-plexer filter stage is susceptible to receive surge energy via an input conductor, when the surge energy occurs. A high-pass filter included in a diplexer filter stage applies a radio frequency (RF) signal in a signal path between the input N-plexer filter stage and an output of a Data Over Cable Service Interface Specification (DOCSIS) transmitter stage. A low-pass filter included in the diplexer filter stage couples a surge suppressing threshold device to the signal path to dissipate the surge energy in the surge suppressing threshold device, when the surge energy occurs. The low-pass filter has a cut-off frequency that is lower than a normal operation frequency range of the RF signal. The low-pass filter isolates the surge suppressing threshold device from the signal path in normal operation frequency range of the RF signal, when no surge energy is applied.

18 Claims, 6 Drawing Sheets

(51) Int. Cl.
  *H03H 1/00* (2006.01)
  *H04B 3/00* (2006.01)
  *H04N 7/10* (2006.01)

(58) Field of Classification Search
  USPC .......................................................... 361/119
  See application file for complete search history.

(56) References Cited

U.S. PATENT DOCUMENTS

| | | |
|---|---|---|
| 7,463,472 B1 | 12/2008 | Bell |
| 8,441,795 B2* | 5/2013 | Jones ........................ H01T 4/08 |
| | | 333/185 |
| 2003/0013453 A1* | 1/2003 | Lavaud ..................... H04L 5/14 |
| | | 455/450 |
| 2003/0192063 A1 | 10/2003 | Runkle |
| 2008/0022344 A1* | 1/2008 | Riggsby ............. H04N 7/17309 |
| | | 725/129 |
| 2009/0067103 A1 | 3/2009 | Kijima et al. |
| 2011/0279943 A1 | 11/2011 | Penwell et al. |

* cited by examiner

SURGE PROTECTOR FOR A TRANSCEIVER

FIELD OF THE INVENTION

This application claims the benefit, under 35 U.S.C. § 365 of International Application PCT/US2015/023487 filed Mar. 31, 2015, which was published in accordance with PCT Article 21(2) on Dec. 3, 2015in English and which claims the benefit of United States provisional patent application No. 62/004,483 filed May 29, 2014. The provisional and PCT applications are expressly incorporated by reference herein in their entirety for all purposes.

The invention relates to a surge protector coupled to a transmission line connector.

BACKGROUND OF THE INVENTION

In the cable network example, the cable head end typically provides input signals to, for example, a set-top box. A multiplexing filter forms an input/output stage of the set-top box. The input signals, applied via a transmission line, may contain, for example, television signals. In a, so-called, Data Over Cable Service Interface Specification (DOCSIS) return channel, a transmitter generates an output signal at a frequency range of 5-54 MHz that is applied through the multiplexing filter.

Surges in transmission line voltages can change the operating range of the components and severely damage and/or destroy them. There are many sources which can cause harmful electrical energy surges. One source is a radio frequency (RF) interference that can be coupled to transmission lines from a multitude of sources. The transmission lines act as large antennas that may extend over several miles, thereby collecting a significant amount of RF noise power from such sources as radio broadcast antennas. Another source could be lightning. Therefore, it may be desirable to interpose an RF surge suppression device, forming direct current (DC) short or low impedance when a surge occurs.

Typical lightning waveforms are approximated by simpler waveforms described in the IEC 61000-4-5 document. Those waveforms have substantial low frequency content. The multiplexing filter at the input of the set-top box passes a substantial amount of energy in the low frequency range. Therefore, without surge protection, the multiplexing filter, disadvantageously, might transfer the energy from the surge to the DOCSIS transmitter output, exposing that transmitter to large voltages that could damage it. The same potential problem may be applicable also to a receiver or a transceiver, not shown, and it would also need to be protected.

A common practice for protecting consumer electronics is to place a surge protection device directly at the input of the set-top box to be protected. For example, a gas discharge tube will be placed at the RF connector input known as F connector. There is a minimum firing voltage that is necessary to meet and an appreciable length of time required for the protection device to turn on to provide the required protection. During such turn on delay time, the electronics might be exposed to large voltages. Those voltages can cause damage.

Using an additional, secondary protection that can be provided by a transient high speed diode also has a disadvantage. If such high speed diode is to be connected to an output terminal of, for example, the DOCSIS transmitter, the transmitter output signal itself might cause the diode to conduct, when an output signal of the transmitter is sufficiently large. The diode conduction might, disadvantageously, produce harmonics in the transmitted signal in normal operation. Harmonics in the transmitted signal are undesirable because they cause signal interference to other services. Therefore, it may be desirable to increase the isolation between the surge protection device and the transmitter output.

SUMMARY OF THE INVENTION

An apparatus for performing a method that provides protection against surge energy includes an N-plexer filter coupled to a conductor susceptible to apply the surge energy to the N-plexer filter, when the surge energy occurs. A second filter is coupled between the N-plexer filter and one of a transmission stage and a receiver stage for applying a radio frequency (RF) signal at a normal operation frequency range between the N-plexer filter and the one stage, in normal operation. A low-pass filter has a cut-off frequency that is lower than the normal operation frequency range. The low-pass filter is coupled to the second filter to form with the second filter a diplexer filter for coupling the surge energy to a surge suppressing threshold device to dissipate the surge energy in the surge suppressing threshold device, when the surge energy occurs. The low-pass filter isolates the surge suppressing threshold device from each of the second filter and the N-plexer filter at the normal operation frequency range.

BRIEF DESCRIPTION OF THE DRAWINGS

The preferred embodiment of the present arrangement will be described below in more detail with reference to the accompanying drawings in which.

DETAILED DESCRIPTION

Figure 1:
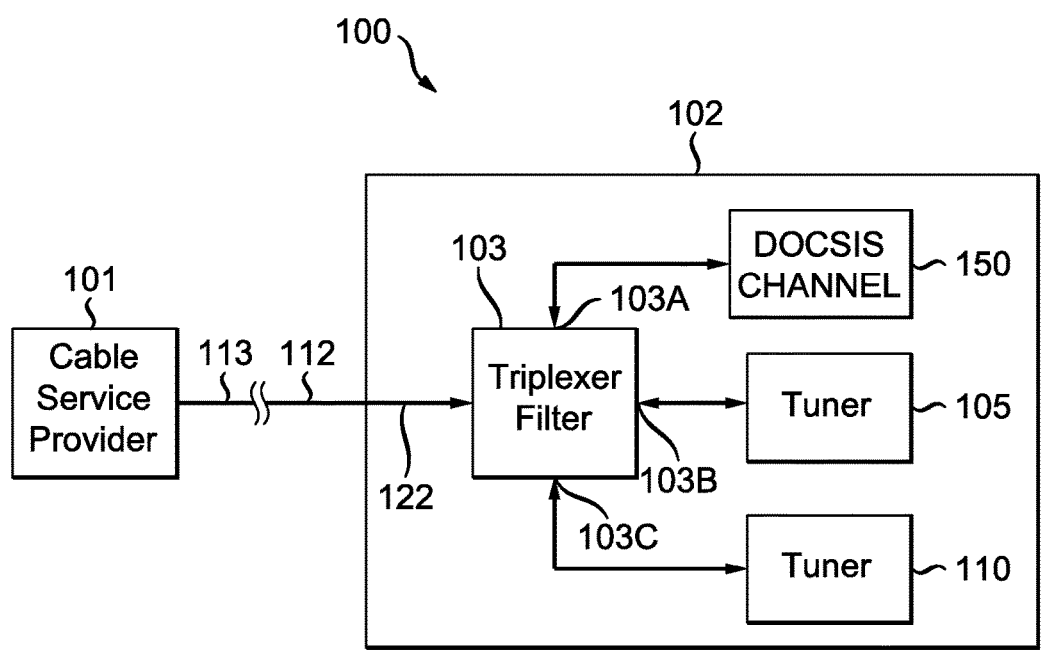
FIG. 1 illustrates, in a block diagram, a set-top box, embodying an advantageous feature.

FIG. 1 illustrates, in a block diagram, a signal receiving device 100, embodying an advantageous feature, which includes a set-top box 102. Signal receiving device 100 receives signals from a cable service provider 101 representing broadcast audio and video programs and content. Signal receiving device 100 includes components that reside inside a user's premises. Cable service provider 101 communicates an RF signal 113 that includes cable television signal in the range of 54 MHz to 1000 MHz and a Data Over Cable Service Interface Specification (DOCSIS) signal in the range of 5-54 MHz. In addition, RF signal 113 may include multimedia over cable alliance (MOCA) home network system signal that is bidirectional and operates in a frequency spectrum of 1100 MHz-1600 MHz.

Cable service provider 101 is coupled to set top box 102 via a transmission line 112 having a characteristic impedance of, for example, 75 Ohm. Transmission line 112 is susceptible to apply RF surge energy to set top box 102, as explained before. One or more components of set-top box 102 may be integrated with a display device, such as a television or display monitor, not shown.

Within set top box 102, an input RF F connector, not shown, is coupled to a well-known N-plexer stage, for example, a triplexer filter 103. Filter 103 forms a load of, for example, 75 Ohm at a dual function, input/output terminal 122. Filter 103 is coupled to, for example, a tuner 105 via a filter terminal 103B and, for example, to a tuner 110 via a filter terminal 103c.

Figure 2:
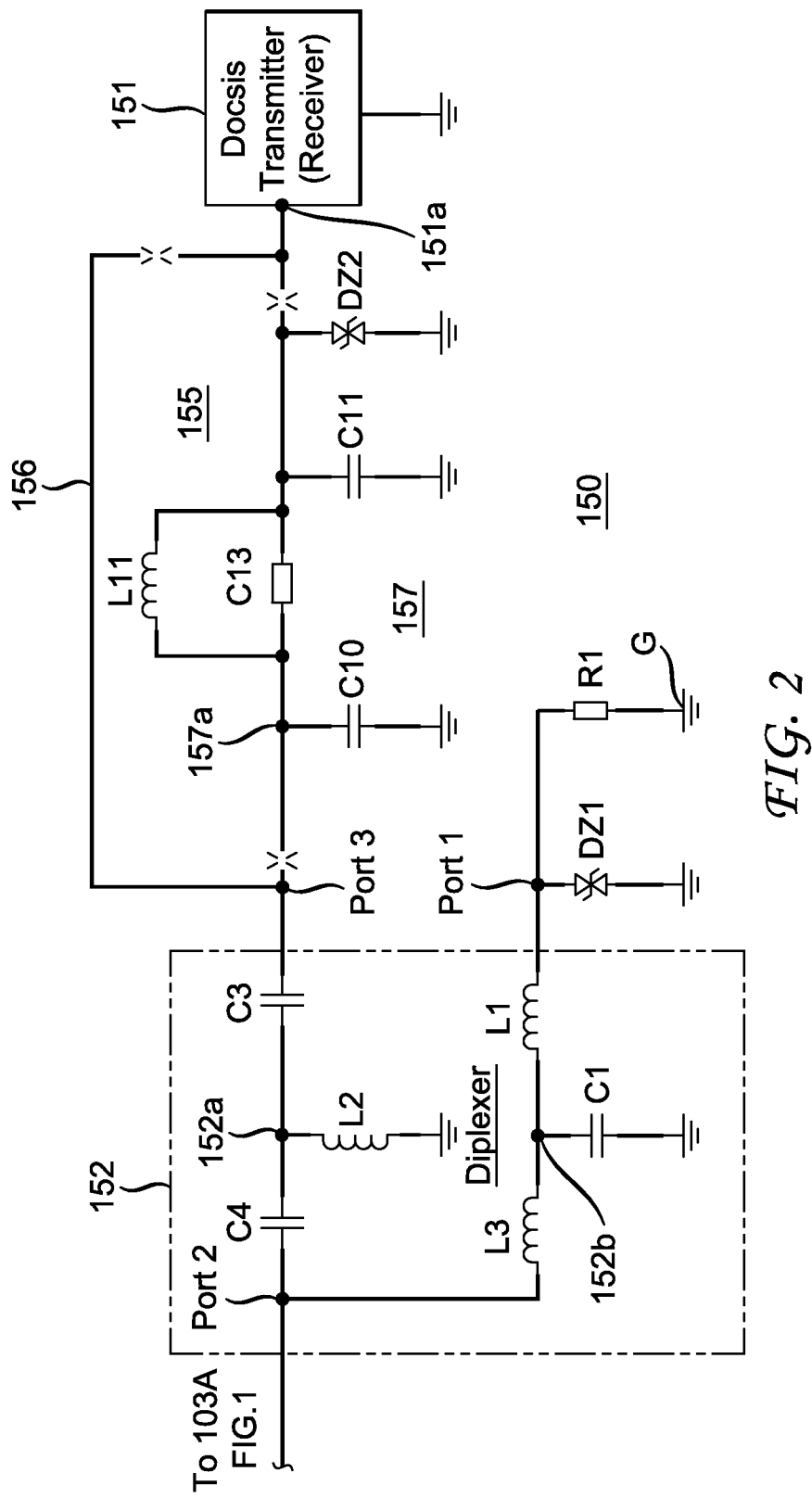
FIG. 2 illustrates, partially in a block diagram and partially in details, a portion of the circuit of FIG. 1, embodying an advantageous feature, that includes a surge protector.

In a reverse mode operation, filter 103 is coupled to DOCSIS reverse channel 150 in a manner embodying an advantageous feature. The DOCSIS standard specifies that the return link, from the cable end user to the cable head end, a transmitter in the approximate frequency band of 5 to 54 MHz should be used. Accordingly, DOCSIS channel 150 operates in a frequency range of 5-54 MHz FIG. 2 illustrates in more details DOCSIS channel 150 of FIG. 1. Similar symbols and numerals in FIGS. 1 and 2 indicate similar items or functions. In reverse operation mode of DOCSIS channel 150 of FIG. 2, an RF output signal, not shown, is generated at an output terminal 151a of a DOCSIS transmitter 151.

In a first advantageous embodiment, output terminal 151a is coupled via a conductor 156 to an input port 3 of a passive diplexer 152. In the first advantageous embodiment, a network 155 that includes a low-pass filter 157 and a protection diode DZ2 is excluded from any signal path between output terminal 151a and port 3 and has no effect. Thus, the output signal that is generated at output terminal 151a is applied via conductor 156 to input port 3 of passive diplexer 152. Therefore, a resulting output signal of passive diplexer 152 at a port 2 of passive diplexer 152 is applied via an input terminal 103A of triplexer filter 103 of FIG. 1 and input/output terminal 122 of triplexer filter 103 to transmission line 112. Thus, terminal 122 forms, in the reverse operation mode of DOCSIS channel 150 of FIG. 2, an output terminal of triplexer filter 103 of FIG. 1.

In passive diplexer 152 of FIG. 2, a capacitor C3 and a capacitor C4 are coupled in series between ports 3 and 2. An inductor L2 is coupled between a ground or common conductor G and a junction terminal 152a, that is coupled between capacitors C3 and C4 to form a T-shaped configuration. Inductor L2, capacitor C3 and capacitor C4 form a high pass filter for passing DOCSIS channel frequency range of 5-54 MHz from port 3 to port 2.

Figure 3:
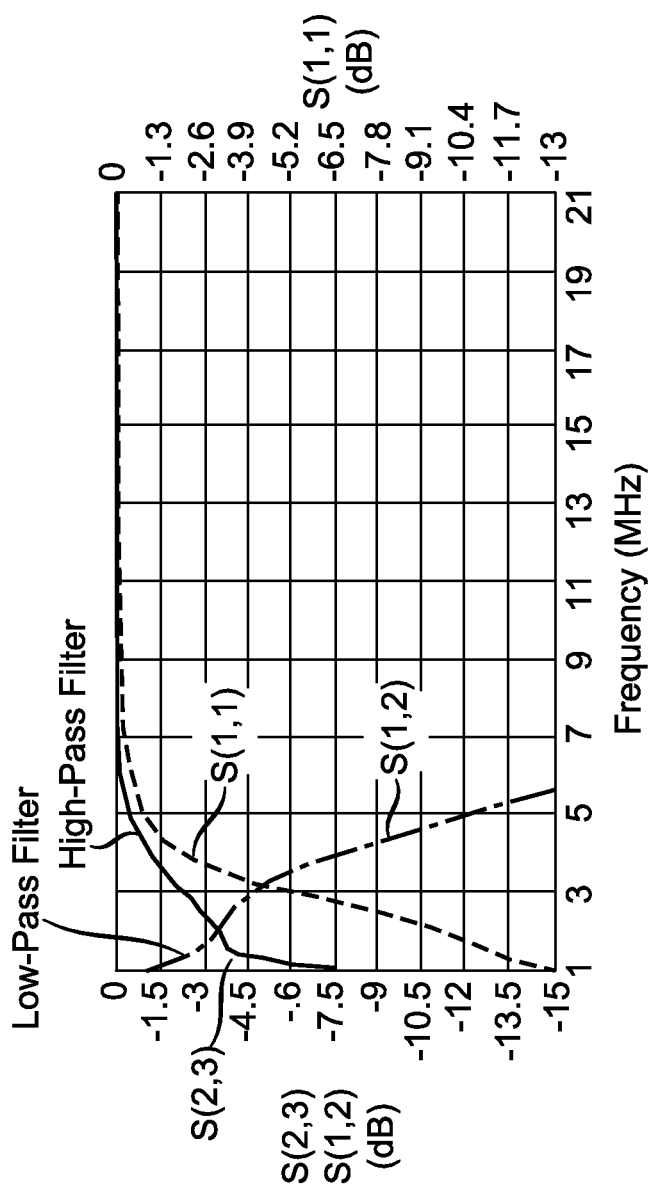
FIGS. 3, 4, 5 and 6 illustrate, each, a corresponding graph obtained from a simulation that depicts variations of a corresponding parameter or parameters of the circuit of FIG. 2 as a function of frequency.

Calculated or simulated parameters of the three-port network diplexer 152, as a function of frequency, are provided in FIGS. 3, 4, 5 and 6. Similar symbols and numerals in FIGS. 1, 2, 3, 4, 5 and 6 indicate similar items or functions. For the purpose of the simulation transmitter output terminal 151a is directly coupled via conductor 156 to input port 3 of passive diplexer 152 and network 155 is excluded. Also, for the purpose of the simulation, the values of the elements of diplexer 152 of FIG. 2 are, as follows: inductor L2=6.8 uH, capacitor C3=3.3 nF, capacitor C4=1.2 nF, capacitor C1=820 pF, inductor L3=1.8 uH and inductor L1=5.6 uH. In particular, FIG. 3 illustrates a graph in solid line of transmission characteristic, S(2,3), of high pass filter of diplexer 152 from port 2 to port 3 of FIG. 2.

In diplexer 152, an inductor L3 and an inductor L1 are coupled in series between port 2 and a port 1. A capacitor C1 is coupled between ground conductor G and a junction terminal 152b, that is coupled between inductors L3 and L1 to form a T-shaped configuration. Capacitor C1, inductor L3 and inductor L1 form a low pass filter such that the high and low pass filters of diplexer 152 are joined at port 2.

In carrying out an advantageous feature, a surge suppressing threshold zener diode, surge diode DZ1, for example, transient voltage suppressor (TVS) SP3021 made by Littelfuse, is coupled between ground conductor G and output port 1. Additionally, a terminating resistor R1=75 Ohm is coupled in parallel with surge diode DZ1.

FIG. 3 also illustrates a graph in dotted line depicting the low pass transmission characteristic, S(2,1), from port 1 to port 2. According to FIG. 3, a frequency in which the transmission of high pass filter, that includes capacitors C3 and C4, and that of the low pass filter of diplexer 152 of FIG. 2 are equal and cross each other, referred to as the crossover frequency, is at 2 MHz. The manner of selecting the values of the inductors and capacitors for establishing the desired crossover frequency between high and low pass filters is well known in the art.

In carrying out an advantageous feature, low-pass filter of diplexer filter 152 formed by capacitor C1, inductor L3 and inductor L1 diverts the energy of a surge that may be coupled via transmission line 112 of FIG. 1 to power dissipating resistor R1 and surge diode DZ1. But for the low-pass filter of diplexer filter 152 formed by capacitor C1, inductor L3 and inductor L1, the surge energy could have been coupled from triplexer 103 to transmitter 151 via a signal path that includes the high-pass filter of diplexer 152. In this way, the energy of the surge, for example, of lightning is prevented from being channeled to DOCSIS transmitter 151. In the case of very light surges, diode DZ1 does not conduct and the energy is dissipated entirely in resistor R1. On the other hand, in the case of a larger amplitude surge, diode DZ1 conducts and dissipates internally the surge energy. Thus, for protecting DOCSIS transmitter 151, -inductor L3 and inductor L1 of the low-pass filter isolate port 1, to which diode DZ1 is connected, from output terminal 151a of DOCSIS transmitter 151. In addition, at the frequency range of interest, 5-54 MHz, in normal operating voltages, inductor L3 and inductor L1 of the low-pass filter prevent the output signal from DOCSIS transmitter 151 from partly turn on protection diode DZ1. Consequently, inductor L3 and inductor L1 of the low-pass filter, advantageously, prevent harmonics from ever being generated at output terminal 151a of DOCSIS transmitter. If the surge energy becomes sufficiently large, transient protection diode DZ1 starts to conduct, thus effectively shorting port 1 to ground potential G. In passive filter 152, the resulting short on port 1 will also present low impedance at common port 2, so as to substantially reduce energy from the surge from being channeled through diplexer 152. If, instead, DOCSIS transmitter 151 was connected directly to a main surge protection diode that is similar to diode DZ1, then, undesirably, there could be an increase in the harmonics content at output terminal 151a. The reason for the generation of harmonics is that such diode is nonlinear when, as a result of a high level output signal from transmitter 151, it becomes partly conductive.

Figure 4:
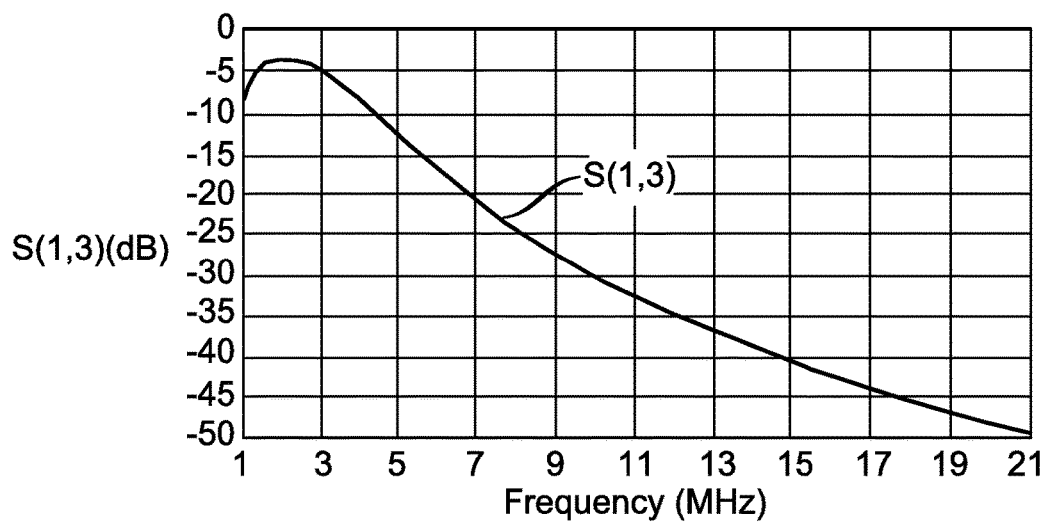

FIG. 4 shows the isolation between ports 1 and 3, S(1,3), as a function of frequency. Diplexer 152 of FIG. 2 that is of the $3^{rd}$ order Butterworth filter type provides isolation, as shown in the graph of FIG. 4, of about 12.5 dB between ports 1 and 3 at the lowest applicable frequency of interest, 5 MHz, for DOCSIS transmitter 151. An even higher isolation might be possible by using a different type of filter or a higher order filter.

Figure 5:
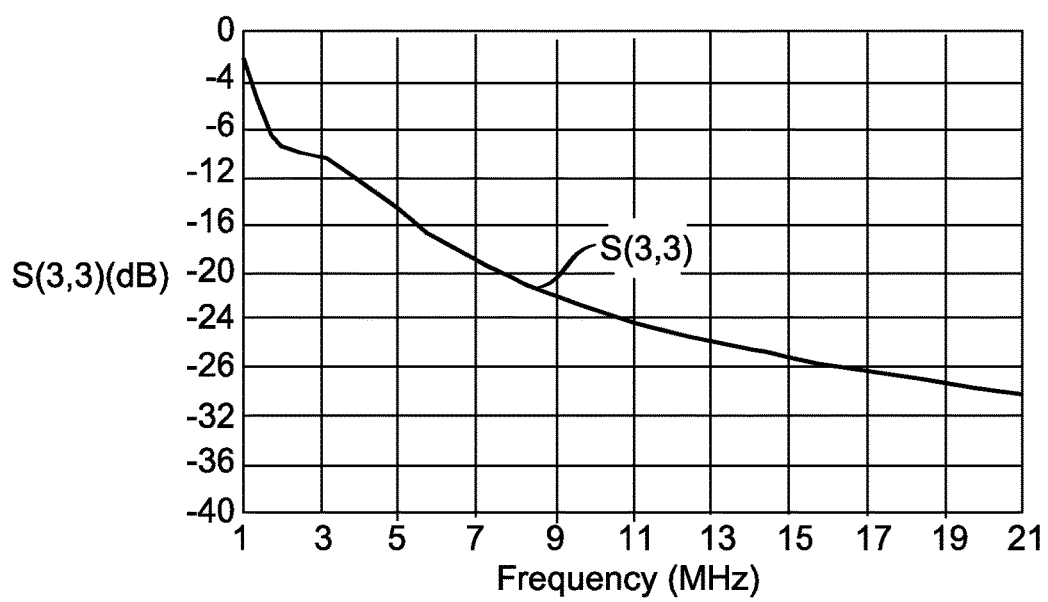
Figure 6:
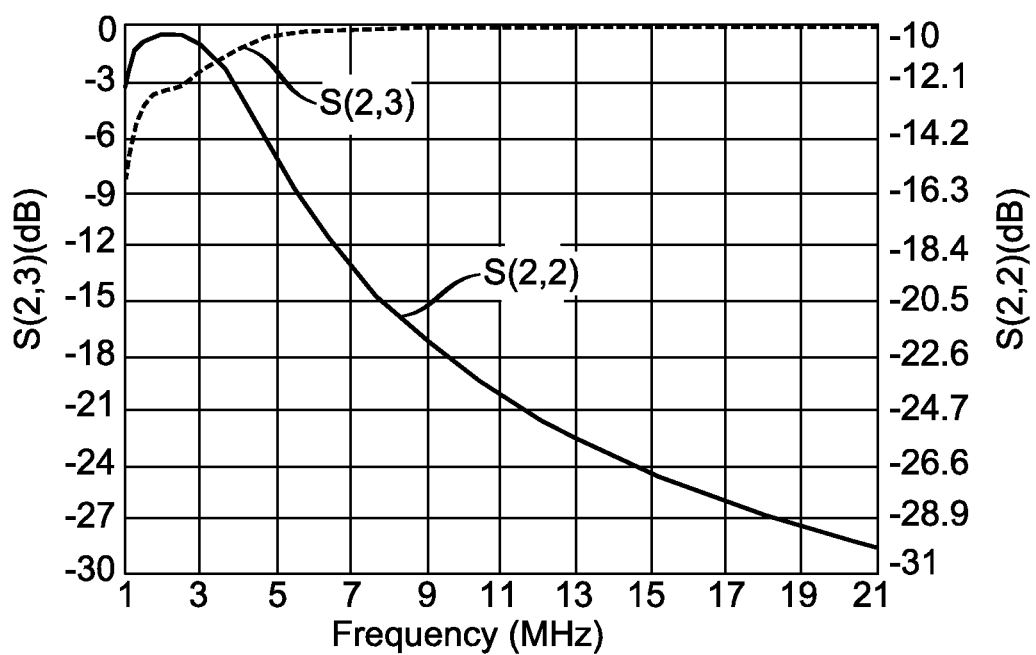

It may be desirable to maintain the input return loss at each port at least at −10 db. This ensures that any undesirable interaction between different subsystems will be reduced. FIG. 5 shows the return loss of port 3. FIG. 6 shows the return loss from port 2, in solid line, and the transmission loss between port 2 and port 3, in dotted line.

In a second advantageous embodiment, an additional surge diode DZ2 of the type, for example, TVS SP3021 made by Littelfuse is coupled between output terminal 151a of transmitter 151 and ground conductor G. In addition, conductor 156 of FIG. 2 is removed from the circuit and, instead, terminal 151a is coupled via a low-pass filter 157 to port 3. Low-pass filter 157 includes a capacitor C11 of 68 pF that is coupled between terminal 151a and ground conductor G. A parallel arrangement of an inductor L11 of 270 nH and a capacitor C13 of 3.3 pF is coupled between terminal 151a and port 3. In addition, a capacitor C10 of 68 pF is coupled between ground terminal G and port 3 that is coupled to junction terminal 157a, disposed between inductor L11 and capacitor C13.

Figure 7:
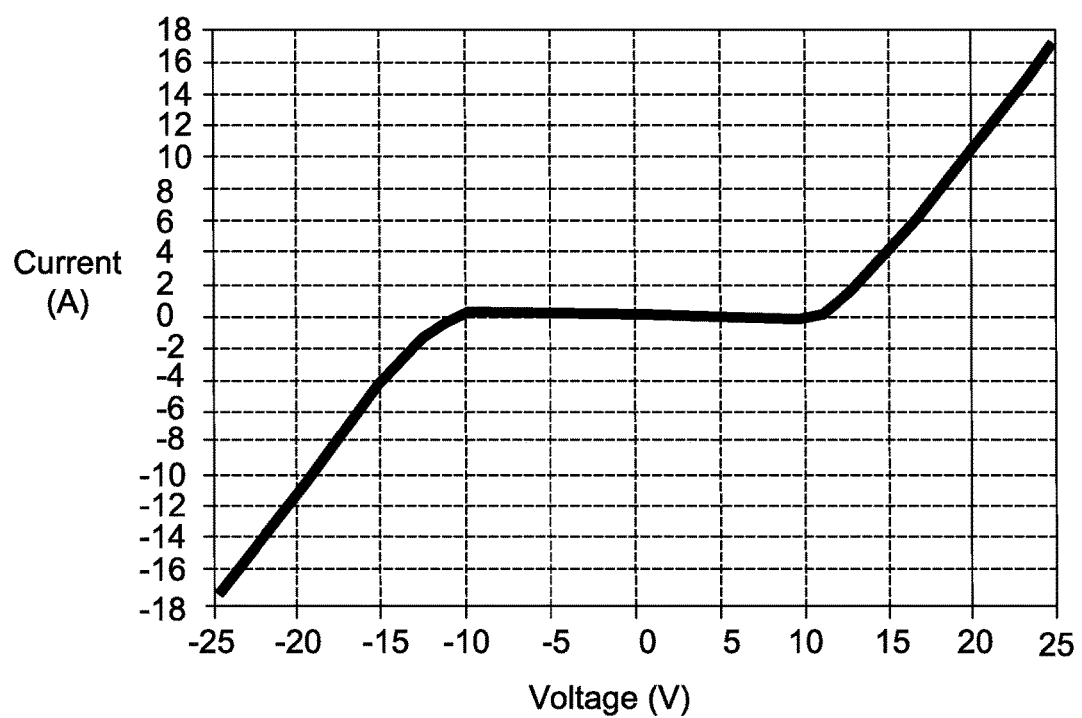
FIG. 7 illustrates a graph characterizing the surge protector of FIGURE. 2.

The current vs. voltage characteristic of diode DZ2 is shown in FIG. 7. In this example, for voltages lower than about 10V peak-to-peak, there is only an insubstantial conduction. However, because practical devices might have a non-negligible conduction it still could create a nonlinear behavior in transmission channel 150. This could have generated harmonics of the transmitter frequency. Including low-pass filter 157 in the signal path between transmitter 151 and port 3, results in an overall band-pass filter. The purpose of such low-pass filter 157 is to attenuate harmonics that may be produced by DOCSIS transmitter 151 and those that may be produced by the nonlinear effect introduced by protection diode DZ2. The values of the components forming the resulting band-pass filter are optimized to form constant impedance for port 2 of diplexer 152 that is coupled to triplexer 103. Furthermore, the impedance presented to DOCSIS transmitter 151 is also optimized by the selected component values. It should be understood that, in an alternative embodiment, diplexer 152 can be coupled to a receiver or a signal processing stage, instead of to DOCSIS transmitter 151, for providing surge protection to such receiver or signal processing stage.

The invention claimed is:

1. An apparatus for providing protection against surge energy, comprising:
   an N-plexer filter coupled to a conductor susceptible to apply the surge energy to said N-plexer filter, when the surge energy occurs;
   a first surge suppressing threshold device;
   a diplexer including a first filter configured as a low-pass filter and a second filter coupled between said N-plexer filter and one of a transmission stage and a receiver stage for applying a radio frequency (RF) signal at a normal operation frequency range between said N-plexer filter and said one stage, said low-pass filter coupled between said N-plexer filter and said first surge suppressing threshold device for diverting the surge energy from said N-plexer filter to said first surge suppressing threshold device to dissipate the surge energy in said first surge suppressing threshold device, when the surge energy occurs, and for increasing RF isolation, at said normal operation frequency range, between said first surge suppressing threshold device and at least one of said N-plexer filter and said one stage; and
   a second surge suppressing threshold device coupled to an output of said one stage and a third filter coupled between said one stage output and said second filter for filtering out harmonics;
   wherein the first filter, the second filter, and the third filter are configured as multicomponent filters.

2. An apparatus according to claim 1 wherein said conductor is coupled to an RF transmission line that is susceptible to apply the surge energy to said N-plexer filter.

3. An apparatus according to claim 2 wherein said low-pass filter forms low impedance to provide a current path for the surge energy that activates said surge suppressing threshold device to provide protection when the surge energy is applied via said transmission line.

4. An apparatus according to claim 1 wherein said second filter comprises a high-pass filter.

5. An apparatus according to claim 4 wherein said high-pass filter is structured to have a T-shaped configuration.

6. An apparatus according to claim 1 wherein said low-pass filter is structured to have a T-shaped configuration.

7. An apparatus according to claim 1 wherein said one stage comprises a Data Over Cable Service Interface Specification (DOCSIS) transmitter stage.

8. An apparatus according to claim 1, wherein said surge suppressing threshold device comprises a zener diode.

9. An apparatus according to claim 1 wherein said diplexer has a first port coupled to said surge suppressing threshold device, a second port coupled to said input N-plexer filter and a third port coupled to said one stage.

10. An apparatus according to claim 9 wherein said diplexer provides isolation between said first and second ports that meets S (1, 3) parameter value of 12 dB to provide isolation at the lowest frequency of the normal operation frequency range.

11. An apparatus according to claim 10 wherein the lowest frequency of the normal operation frequency range is 5 MHz.

12. A method for providing protection against surge energy, comprising:
   providing an N-plexer filter coupled to a conductor susceptible to apply the surge energy to said N-plexer filter, when the surge energy occurs;
   providing a diplexer that includes a first filter configured as a low-pass filter and a second filter for applying a radio frequency (RF) signal at a normal operation frequency range between said N-plexer filter and one of a transmission stage and a receiver stage, the low-pass filter for coupling the surge energy to a first surge suppressing threshold device to dissipate the surge energy in said first surge suppressing threshold device, when the surge energy occurs, and for increasing RF isolation between said first surge suppressing threshold device and at least one of said N-plexer filter and said one stage, at said normal operation frequency range; and
   coupling a second surge suppressing threshold device to an output of said one stage and coupling a third filter between said one stage output and said second filter for filtering out harmonics;
   wherein the first filter, the second filter, and the third filter are each configured as multicomponent filters.

13. A method according to claim 12 further comprising, coupling said conductor to an RF transmission line.

14. A method according to claim 13 wherein said low pass filter forms low impedance to provide protection when the surge energy that is applied via said transmission line to activate said first surge suppressing threshold device.

15. A method according to claim 12 further comprising, high-pass filtering said RF signal in said second filter.

16. A method according to claim 15 further comprising, structuring said high-pass filter to have a T-shaped configuration.

17. A method according to claim 12 further comprising, structuring said low-pass filter to have a T-shaped configuration.

18. A method according to claim 12 further comprising, transmitting said RF signal in a Data Over Cable Service Interface Specification (DOCSIS) transmitter stage.

* * * * *